(12) United States Patent
Kim et al.

(10) Patent No.: US 8,742,880 B2
(45) Date of Patent: Jun. 3, 2014

(54) SINGLE DIFFERENTIAL TRANSFORMER CORE

(75) Inventors: Young Gon Kim, San Jose, CA (US); Hong Sun Kim, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/356,478

(22) Filed: Jan. 23, 2012

(65) Prior Publication Data

US 2013/0106553 A1  May 2, 2013

Related U.S. Application Data

(60) Provisional application No. 61/553,049, filed on Oct. 28, 2011.

(51) Int. Cl.
*H01F 5/00* (2006.01)
(52) U.S. Cl.
USPC .......................................... 336/200
(58) Field of Classification Search
USPC ................... 336/200, 232; 257/531
See application file for complete search history.

(56) References Cited

U.S. PATENT DOCUMENTS

| | | | |
|---|---|---|---|
| 6,635,948 B2 | 10/2003 | Ahn et al. | |
| 6,707,367 B2 | 3/2004 | Castaneda et al. | |
| 7,161,427 B2 | 1/2007 | Westwick et al. | |
| 7,245,190 B2 | 7/2007 | Copani et al. | |
| 7,796,076 B2 * | 9/2010 | Melanson | 341/155 |
| 7,904,108 B2 * | 3/2011 | Castaneda et al. | 455/550.1 |
| 7,974,599 B2 * | 7/2011 | Roufoogaran | 455/333 |
| 2010/0194485 A1 | 8/2010 | Chawla et al. | |
| 2011/0032044 A1 | 2/2011 | Lee et al. | |
| 2012/0119845 A1 * | 5/2012 | Lu et al. | 333/26 |

FOREIGN PATENT DOCUMENTS

JP         5006829 A       1/1993

OTHER PUBLICATIONS

International Search Report and Written Opinion—PCT/US2012/062491—ISA/EPO—Apr. 19, 2013.
Partial International Search Report—PCT/US2012/062491—ISA/EPO—Jan. 23, 2013.
Syu, J.S., et al., "Site HBT quadrature VCO utilizing trifilar transformers", Solid-State Circuits Conference, 2008. A-SSCC '08. IEEE Asian, IEEE, Piscataway, NJ, USA, Nov. 3, 2008, pp. 465-468, XP031373063, ISBN: 978-1-4244-2604-1 figures 2,3.
Tseng, Y.R., et al., "A 7-GHz, Low-Power, Low Phase-Noise Differential Current-Reused VCO Utilizing a Trifilar-Transformer-Feedback Technique", IEICE Transactions on Electronics, vol. E94-C, No. 4, Apr. 1, 2011, pp. 648-653, XP055002262, ISSN: 0916-8524, DOI: 10.1587/transele.E94.C648 figure 8.
Tseng, Y.R., et al., "On-Chip Trifilar-Transformer-Coupled Quadrature Signal Generation Methodology", Innovative Computing, Information and Control (ICICIC), 2009 Fourth International Conference on, IEEE, Piscataway, NJ, USA, Dec. 7, 2009, pp. 569-572, XP031627380, ISBN: 978-1-4244-5543-0 figures 4, 5.

* cited by examiner

*Primary Examiner* — Tuyen Nguyen
(74) *Attorney, Agent, or Firm* — William M. Hooks (57) ABSTRACT

An integrated circuit is disclosed. The integrated circuit includes a primary coil. The integrated circuit also includes a first secondary coil that acts as a first transformer with the primary coil. The integrated circuit further includes a second secondary coil that acts as a second transformer with the primary coil. The primary coil, the first secondary coil and the second secondary coil have a layout on the integrated circuit to minimize coupling between the first secondary coil and the second secondary coil.

10 Claims, 9 Drawing Sheets

SINGLE DIFFERENTIAL TRANSFORMER CORE

CLAIM OF PRIORITY UNDER 35 U.S.C. §119

This application is a non-provisional application claiming priority to provisional application Ser. No. 61/553,049, filed on Oct. 28, 2011, entitled "SINGLE DIFFERENTIAL TRANSFORMER CORE", and assigned to the assignee hereof and hereby expressly incorporated by reference herein.

TECHNICAL FIELD

The present disclosure relates generally to electronic communications. More specifically, the present disclosure relates to systems and methods for a single differential transformer core.

BACKGROUND

Wireless communication systems are widely deployed to provide various types of communication content such as voice, video, data, and so on. These systems may be multiple-access systems capable of supporting simultaneous communication of multiple wireless communication devices with one or more base stations.

For proper reception and transmission of wireless signals on a wireless communication network, a wireless communication device may use one or more voltage controlled oscillators (VCO) to generate a signal with a desired frequency. Wireless communication device and/or wireless communication system specifications may require that the amplitude of the signal generated meets certain requirements while the signal also maintains high levels of reliability. In addition, a wireless communication device may operate using batteries. Therefore, a voltage controlled oscillator using less current is advantageous. Benefits may be realized by providing improvements to voltage controlled oscillators (VCOs) and improvements relating to circuitry within voltage controlled oscillators (VCOs).

SUMMARY

An integrated circuit is described. The integrated circuit includes a primary coil, a first secondary coil that forms a first transformer with the primary coil and a second secondary coil that forms a second transformer with the primary coil.

A first coupling may occur between the primary coil and the first secondary coil to form the first transformer. A second coupling may occur between the primary coil and the second secondary coil to form the second transformer. The primary coil, the first secondary coil and the second secondary coil may have a layout on the integrated circuit to minimize coupling between the first secondary coil and the second secondary coil. The primary coil, the first secondary coil and the second secondary coil may be inductors. The first transformer and the second transformer may form a single differential transformer core. The single differential transformer core may be used in a low noise amplifier or a power amplifier.

The single differential transformer core may be used with a divide-by-2 loading circuit to form a voltage controlled oscillator. The voltage controlled oscillator may include a first transistor coupled between the first secondary coil and the primary coil and a second transistor coupled between the second secondary coil and the primary coil. The primary coil may be coupled between the gate of the first transistor and the gate of the second transistor. The first secondary coil may be coupled between the drain of the first transistor and the divide-by-2 loading circuit. The second secondary coil may be coupled between the drain of the second transistor and the divide-by-2 loading circuit.

The first transformer and the second transformer may generate frequencies that are twice a desired frequency. The divide-by-2 loading circuit may output a first differential output with the desired frequency and a second differential output with the desired frequency. The integrated circuit may also include a third secondary coil. The third secondary coil and the second secondary coil may form a third transformer.

A method for forming a single differential transformer core is also described. A first coupling is provided between a first coil and a second coil to form a first transformer. A second coupling is provided between the second coil and a third coil to form a second transformer. The first transformer and the second transformer are used to form a single differential transformer core.

The first coil, the second coil and the third coil may have a layout on an integrated circuit to minimize coupling between the first coil and the third coil. The first coil, the second coil and the third coil may be inductors. The first transformer and the second transformer may form a single differential transformer core. The single differential transformer core may be used in a low noise amplifier or a power amplifier. The single differential transformer core may be used with a divide-by-2 loading circuit to form a voltage controlled oscillator. The voltage controlled oscillator may include a first transistor coupled between the first coil and the second coil and a second transistor coupled between the second coil and the third coil. The second coil may be coupled between the gate of the first transistor and the gate of the second transistor. The first coil may be coupled between the drain of the first transistor and the divide-by-2 loading circuit. The third coil may be coupled between the drain of the second transistor and the divide-by-2 loading circuit.

A third coupling may be provided between a fourth coil and the third coil to form a third transformer. The first transformer, the second transformer and the third transformer may be used to form a differential transformer core.

An apparatus is described. The apparatus includes means for providing a first coupling between a first coil and a second coil to form a first transformer. The apparatus also includes means for providing a second coupling between the second coil and a third coil to form a second transformer. The apparatus further includes means for using the first transformer and the second transformer to form a single differential transformer core.

DETAILED DESCRIPTION

Figure 1:
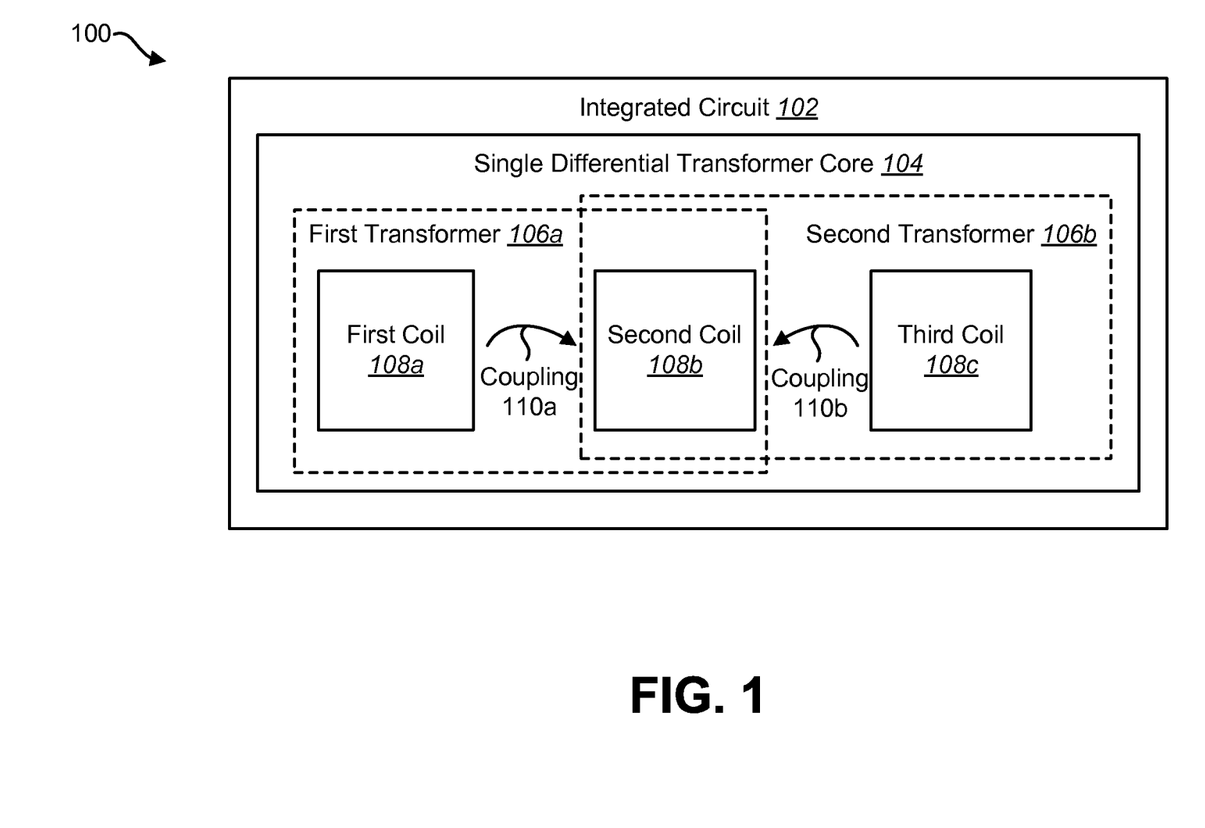
FIG. 1 is a block diagram illustrating a single differential transformer core on an integrated circuit.

FIG. 1 is a block diagram illustrating a single differential transformer core 104 on an integrated circuit 102. A transformer 106 is a static device that transfers electrical energy from one circuit to another through inductively coupled conductors. Transformers 106 are used in many different circuit designs. For example, transformers 106 may be used in voltage controlled oscillators (VCOs) and amplifiers (such as low noise amplifiers (LNAs) and power amplifiers). The single differential transformer core 104 of FIG. 1 may include three coils 108 (also referred to as inductively coupled conductors): a first coil 108a, a second coil 108b and a third coil 108c. In one configuration, the second coil 108b may be referred to as a primary coil while the first coil 108a is referred to as a first secondary coil and the third coil 108c is referred to as a second secondary coil. Differential transformer cores may include additional coils (not shown) that act as both primary coils and secondary coils. Coil and inductor are used interchangeably herein.

The single differential transformer core 104 may include a first transformer 106a and a second transformer 106b. The first transformer 106a may be formed using the first coil 108a and the second coil 108b. A coupling 110a between the first coil 108a and the second coil 108b may allow for the transferring of electrical energy between the first coil 108a and the second coil 108b, forming the first transformer 106a. The second transformer 106b may be formed using the second coil 108b and the third coil 108c. A coupling 110b between the second coil 108b and the third coil 108c may allow for the transferring of electrical energy between the second coil 108b and the third coil 108c, forming the second transformer 106b. Typically, each transformer 106 requires both a primary coil and a secondary coil. Thus, using the single differential transformer core 104 design of FIG. 1 allows for the elimination of a coil (reducing the power consumption and die area used for the transformers 106).

Figure 2:
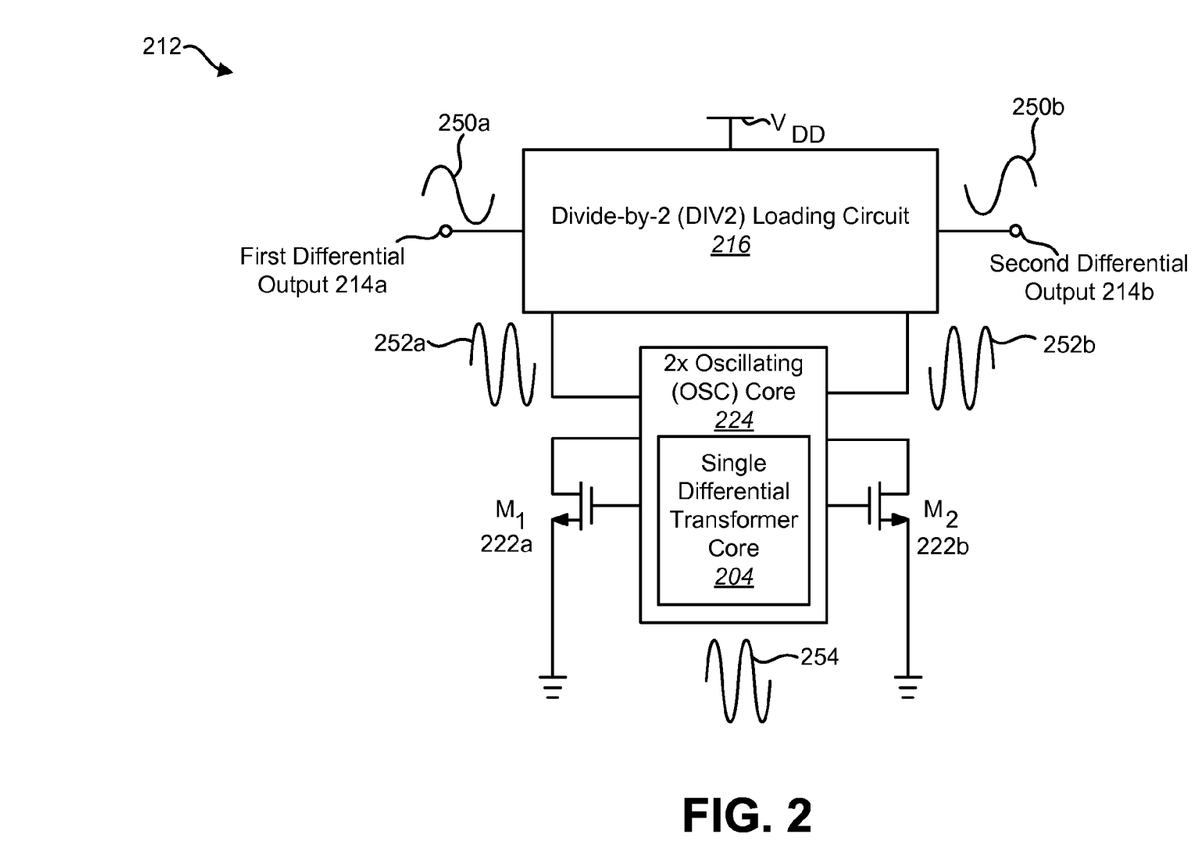
FIG. 2 is a block diagram illustrating a voltage controlled oscillator (VCO) using the present systems and methods.

FIG. 2 is a block diagram illustrating a voltage controlled oscillator (VCO) 212 using the present systems and methods. A voltage controlled oscillator (VCO) 212 may be used in many different applications. For example, a voltage controlled oscillator (VCO) 212 may be used in a local oscillating (LO) signal generator. A voltage controlled oscillator (VCO) 212 may often be used in conjunction with a mixer to demodulate an input data stream to a baseband frequency. The voltage controlled oscillator (VCO) 212 may have two outputs: a first differential output 214a and a second differential output 214b. To guarantee quality of reception, a signal 250a from the first differential output 214a and a signal 250b from the second differential output 214b should always have a 90 degree phase shift. The signals 250 output by the differential outputs 214 may be referred to as differential output signals 250. The differential output signals 250 may also be referred to as inphase and quadrature (I/Q) signals.

One common method for generating precise differential output signals 250 is to generate a signal 254 with a frequency that is twice the desired frequency for the differential output signals 214 using a 2× Oscillating (OSC) core 224 and then divide this signal 254 by two to create the 90 degree phase shifted I/Q signals. To do this, the voltage controlled oscillator (VCO) 212 may include a Divide-by-2 (DIV2) loading circuit 216 coupled between the supply voltage VDD and the 2× Oscillating (OSC) core 224. This method is popular because the voltage controlled oscillator (VCO) 212 output can avoid overlapping with a strong TX output at the 1× local oscillator (LO) frequency. It is generally believed that a strong TX modulated output may generate a pulling to the voltage controlled oscillator (VCO) 212 and thus compromises the clarity of the local oscillator (LO) signal generated by the voltage controlled oscillator (VCO) 212 (i.e., the differential output signals 250). Furthermore, precise I/Q signal generation without first generating a signal 254 with a frequency that is twice the desired frequency is a technically challenging task, oftentimes requiring a complex digital calibration engine.

Another method to generate precise differential output signals 250 is to use a quadrature voltage controlled oscillator (VCO) (not shown) and generate precise I/Q signals with two transconductance (Gm) cores. This solution is only attractive if the design is not restricted by area and/or power. However, applications such as electronic devices and wireless communication devices are restricted by both area and power. Thus, a quadrature voltage controlled oscillator (VCO) is not a suitable solution.

A Global Positioning System (GPS) system is free from voltage controlled oscillator (VCO) 212 pulling since the Global Positioning System (GPS) only uses an RX signal chain. However, due to the simplicity of using a single differential transformer core 204 along with a divide-by-2 (DIV2) loading circuit 216, the use of a 2× Oscillating (OSC) core 224 may be an attractive solution for a Global Positioning System (GPS) system. In the voltage controlled oscillator (VCO) 212, the 2× Oscillating (OSC) core 224 may be combined with the divide-by-2 (DIV2) loading circuit 216 in a single current branch. The 2× Oscillating (OSC) core 224 may be formed between the gates of two Gm transistors, M1 222a and M2 222b. The 2× oscillation energy from the 2× Oscillating (OSC) core 224 may create a differential current that ignites the divide-by-2 (DIV2) loading circuit 216 coupled to the drains of each of the transconductance (Gm) transistors 222. By using this combined oscillator core in the voltage controlled oscillator (VCO) 212, the oscillation current may be reused to operate the divide-by-2 (DIV2) loading circuit 216. Thus, one branch can create precise I/Q signals at the desired frequency.

The 2× Oscillating (OSC) core 224 may include a single differential transformer core 204. The single differential transformer core 204 of FIG. 2 may be one configuration of the single differential transformer core 104 of FIG. 1. The 2× Oscillating (OSC) core 224 may be coupled to the gate of the first NMOS transistor M1 222a and the gate of the second NMOS transistor M2 222b. The source of the first NMOS transistor M1 222a and the source of the second NMOS transistor M2 222b may be coupled to ground. The drain of the first NMOS transistor M1 222a and the drain of the second NMOS transistor M2 222b may also be coupled to the 2× oscillating (OSC) core 224. The 2× oscillating (OSC) core 224 may be coupled to the divide-by-2 (DIV2) loading circuit 216.

The 2× Oscillating (OSC) core 224 may generate a single oscillating signal 254 with a frequency that is twice the desired frequency output of the voltage controlled oscillator (VCO) 212. By passing the single oscillating signal 254 through the first NMOS transistor M1 222a and the second NMOS transistor 222b, two differential output signals 252a-b, each with twice the desired frequency output of the voltage controlled oscillator (VCO) 212, may be generated with a phase difference of 90 degrees. A first oscillating signal 252a (corresponding to the first NMOS transistor M1 222*a*) may be passed through the divide-by-2 (DIV2) loading circuit 216 to obtain the first differential output signal 250*a* with the desired frequency at the first differential output 214*a*. Likewise, a second oscillating signal 252*b* (corresponding to the second NMOS transistor M2 222*b*) may be passed through the divide-by-2 (DIV2) loading circuit 216 to obtain the second differential output signal 250*b* with the desired frequency at the second differential output 214*b*. The first differential output signal 214*a* and the second differential output signal 214*b* may have a phase difference of 90 degrees.

Figure 3:
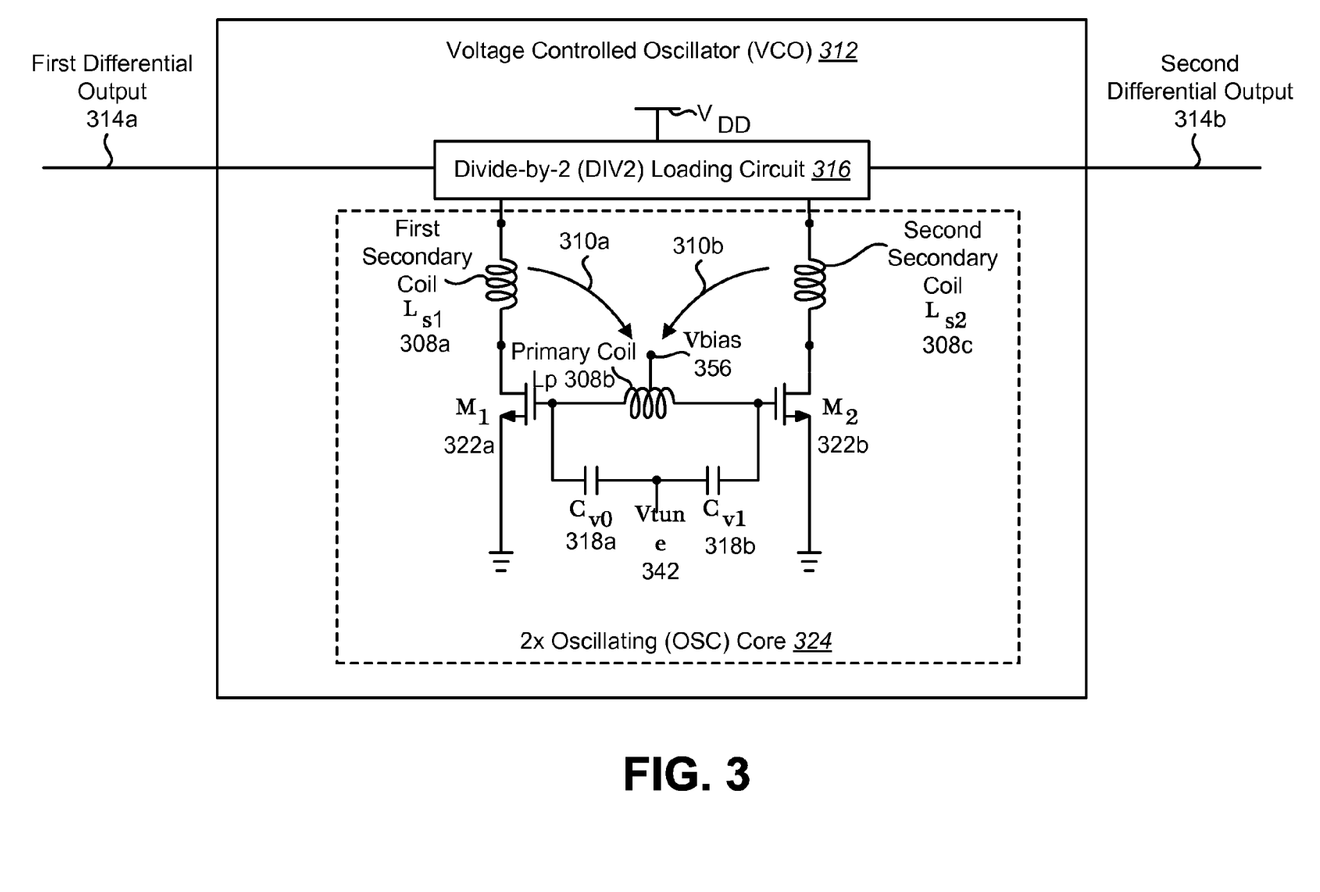
FIG. 3 is a circuit diagram of a voltage controlled oscillator (VCO) using the present systems and methods.

FIG. 3 is a circuit diagram of a voltage controlled oscillator (VCO) 312 using the present systems and methods. The voltage controlled oscillator (VCO) 312 of FIG. 3 may be one configuration of the voltage controlled oscillator (VCO) 212 of FIG. 2. The voltage controlled oscillator (VCO) 312 may include a 2× Oscillating (OSC) core 324 coupled to a divide-by-2 (DIV2) loading circuit 316. The divide-by-2 (DIV2) loading circuit 316 may be coupled to VDD and have two outputs: a first differential output 314*a* and a second differential output 314*b*.

The 2× Oscillating (OSC) core 324 may include a first secondary coil Ls1 308*a*, a primary coil Lp 308*b*, a second secondary coil Ls2 308*c*, a first NMOS transistor M1 322*a*, a second NMOS transistor M2 322*b*, a first capacitor Cv0 318*a* and a second capacitor Cv1 318*b*. The first secondary coil Ls1 308*a* and the primary coil Lp 308*b* may form a first transformer 106*a*. The second secondary coil Ls2 308*c* and the primary coil Lp 308*b* may form a second transformer 106*b*. Thus, the primary coil Lp 308*b* may be part of both the first transformer 106*a* and the second transformer 106*b*. The first secondary coil Ls1 308*a* of FIG. 3 may be one configuration of the first coil 108*a* of FIG. 1. The primary coil Lp 308*b* of FIG. 3 may be one configuration of the second coil 108*b* of FIG. 1. The second secondary coil Ls2 308*c* of FIG. 3 may be one configuration of the third coil 108*c* of FIG. 1.

The first secondary coil Ls1 308*a* may be coupled between the divide-by-2 (DIV2) loading circuit 316 and the drain of the first NMOS transistor M1 322*a*. The source of the first NMOS transistor M1 322*a* may be coupled to ground. The gate of the first NMOS transistor M1 322*a* may be coupled to the primary coil Lp 308*b*. The gate of the first NMOS transistor M1 322*a* may also be coupled to the first capacitor Cv0 318*a*. The primary coil Lp1 308*b* may also be coupled to the gate of the second NMOS transistor M2 322*b*. The gate of the second NMOS transistor M2 322*b* may further be coupled to the second capacitor Cv1 318*b*. The source of the second NMOS transistor M2 322*b* may be coupled to ground. The drain of the second NMOS transistor M2 322*b* may be coupled to the second secondary coil Ls2 308*c*. The second secondary coil Ls2 308*c* may also be coupled to the divide-by-2 (DIV2) loading circuit 316. A DC bias voltage Vbias 356 may be provided to the primary coil Lp 308*b*.

The first capacitor Cv0 318*a* may be coupled to a tuning voltage Vtune 342. The second capacitor Cv1 318*b* may also be coupled to the tuning voltage Vtune 342. The frequency of the voltage controlled oscillator (VCO) 312 may be changed by adjusting the tuning voltage Vtune 342.

To form an oscillation between the gates of the first NMOS transistor M1 322*a* and the second NMOS transistor M2 322*b*, the real component of the tank impedance may need to be canceled out. One traditional way to do this is by introducing negative resistance at the core. In gigahertz (GHz) radio frequency (RF) voltage controlled oscillators (VCOs), a negative resistance has been implemented in the form of a cross-coupled pair between the first NMOS transistor M1 322*a* and the second NMOS transistor M2 322*b*. However, the proposed systems and methods are different since the tank is located at the gates of each of the NMOS transistors 322.

To create positive feedback between a differential pair through a transformer 106, a correct coupling 310*a-b* between the primary coil Lp 308*b* (between the gates of the NMOS transistors 322) and the secondary coils 308*a*, c (at the drain of each NMOS transistor 322) may be formed. Due to the nature of the differential pair, the gates of the NMOS transistors 322 have a 180 phase shift between each other. Each of the gates of the NMOS transistors 322 should be positively coupled to the drains of the other side. If the gate of one NMOS transistor 322 is coupled to its own drain, the formed negative-GM would be killed. Traditionally, the best way to do this has been having two primary coils and two secondary coils, each coupled separately. However, this may be achieved using a single primary coil Lp 308*b* and two secondary coils, Ls1 308*a* and Ls2 308*c*.

If it is assumed that the voltage at Vbias 356 is equal to AC ground, then the differential energy may appear on each side of Vbias 356 towards the gates of the NMOS transistors 322. This energy may be coupled through each transformer 106 to the drain of the NMOS transistor 322, forming a positive feedback and generating negative-GM, which cancels out the lossy component of the tank. The given structure (i.e., the layout illustrated below in relation to FIG. 4) has successfully demonstrated the expected performance in silicon. Even with the area savings, the proposed single differential transformer core 104 claims no power penalty and also offers a higher Q in a voltage controlled oscillator (VCO) 312 tank core, resulting in a better voltage controlled oscillator (VCO) 312 output swing as well as better in-band voltage controlled oscillator (VCO) 312 phase noise.

Figure 4:
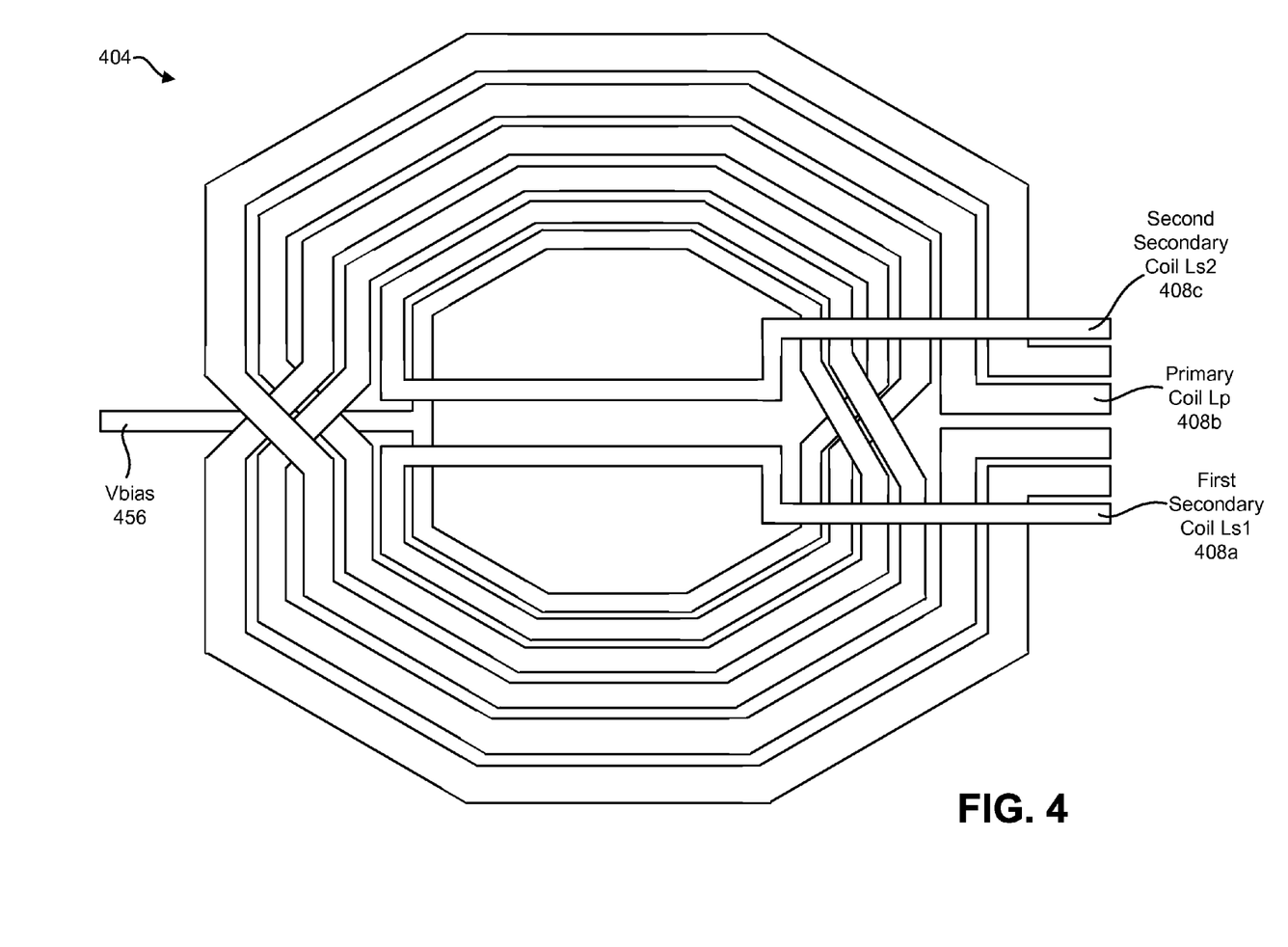
FIG. 4 is a layout diagram illustrating one configuration of a single differential transformer core.

FIG. 4 is a layout diagram illustrating one configuration of a single differential transformer core 404. The layout for the single differential transformer core 404 may include a first secondary coil Ls1 408*a*, a primary coil Lp 408*b* and a second secondary coil Ls2 408*c*. A DC bias voltage Vbias 456 may be provided to the primary coil Lp 408*b*. There are many ways to form secondary coils to form a transformer 106. The goal in transformer 106 design may be to have a higher coupling between a primary coil Lp 408*b* and each secondary coil 408*a*, 408*c* while minimizing the secondary-secondary coupling. In the layout illustrated, the primary coil Lp 408*b* has been implemented with a metal-5 layer, while both the first secondary coil Ls1 408*a* and the second secondary coil Ls2 408*c* have been implemented with AP-layer.

The differential structure and number of turns for the primary coil Lp 408*b* has been decided from oscillation frequency requirements. To be oscillating at around 3 gigahertz (GHz) with reasonable capacitor banks, the value of the primary inductor Lp1 408*b* should be ~2.6-3 nanoHenry (nH). A three turn differential octagon is a reasonable choice to create the primary coil Lp 308*b*. The layout shown in FIG. 4 occupies 300 micrometers (μm)*300 μm=90,000 μm squared=0.09 millimeters squared (mm^2). This is a significant area saving compared to a comparable separate core transformer that occupies 620 μm*340 μm=210,800 μm squared=0.21 mm^2.

In the layout shown, a coupling 110*a* between the primary coil Lp 408*b* and the first secondary coil Ls1 408*a* forms a first transformer 106*a*. Another coupling 110*b* between the primary coil Lp 408*b* and the second secondary coil Ls2 408*c* forms a second transformer 106*b*. By using the single differential transformer core 404 layout illustrated in FIG. 4, 63% of inductor area may be saved when compared to using a layout for a separate core transformer. In a voltage controlled oscillator (VCO) that includes a separate core transformer, the total voltage controlled oscillator (VCO) area is 0.44 mm^2 The total voltage controlled oscillator (VCO) 212 area may be reduced from 0.44 mm^2 to 0.32 mm^2 by using the single core differential transformer 404, saving 27% of the total voltage controlled oscillator (VCO) area 212.

Figure 5:
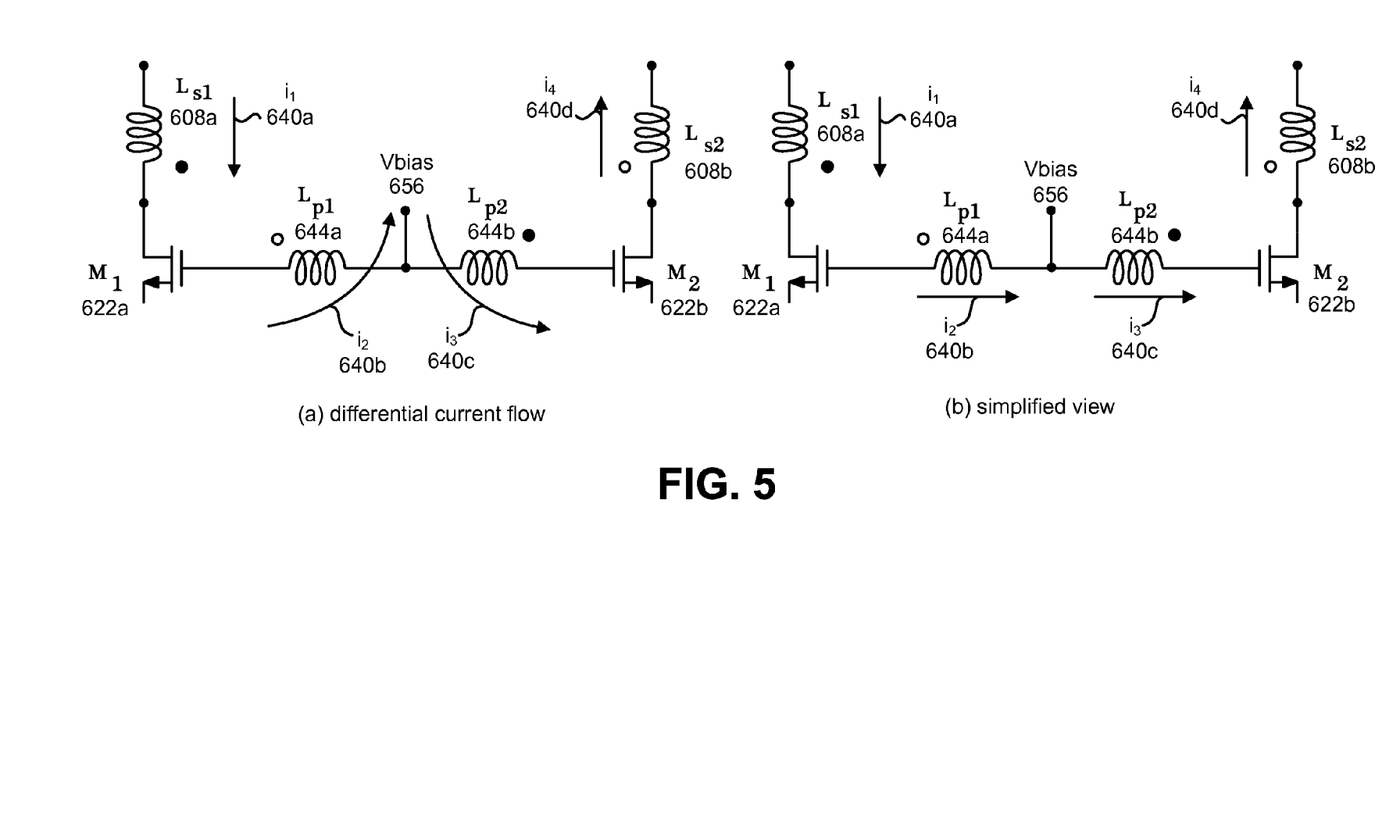
FIG. 5 is a circuit diagram illustrating the differential current flow of a differential transformer core.

FIG. 5 is a circuit diagram illustrating the differential current flow of a differential transformer core. The circuits in FIG. 5 illustrate some of the background theory used to combine two cores into a single core. An important aspect of a single differential transformer core 104 is that the coupling between a secondary inductor and the primary inductor Lp 308*b* is beneficial as long as the coupling polarity is correct. Since the nature of transformer coupling is formed through magnetic flux, absolute voltage level at the coupling point is meaningless. What matters instead is the direction and strength of current flow which creates the flux.

In the differential transformer core, a current i1 640*a* passes through a first secondary inductor Ls1 608*a*. The first secondary inductor Ls1 608*a* is coupled to the drain of a first NMOS transistor M1 622*a*. A first primary inductor Lp1 644*a* is coupled between the gate of the first NMOS transistor M1 622*a* and a bias voltage Vbias 656. A current i2 640*b* flows from the gate of the first NMOS transistor M1 622*a* through the first primary coil Lp1 644*a* and to the bias voltage Vbias 656. A second primary inductor Lp2 644*b* is coupled between the bias voltage Vbias 656 and the gate of a second NMOS transistor M2 622*b*. A current i3 640*c* flows from the bias voltage Vbias 656 through the second primary inductor Lp2 644*b* to the gate of the second NMOS transistor M2 622*b*. The drain of the second NMOS transistor M2 622*b* is coupled to a second secondary inductor Ls2 608*b*. A current i4 640*d* flows from the drain of the second NMOS transistor M2 622*b* through the second secondary inductor Ls2 608*b*.

In a given structure, due to the nature of differential current flow, currents which flow through two primary inductors (i.e., i2 640*b* and i3 640*c*) show the same polarity. Therefore coupling between self primary and secondary (e.g., between Ls1 608*a* and Lp1 644*a*) can also be beneficial. In the simplified view shown in FIG. 5(*b*), i2 640*b* and i3 640*c* are shown with the same polarity. This allows for the first primary inductor Lp1 644*a* and the second primary inductor Lp2 644*b* to be combined into a single primary inductor Lp 308*b* to form a differential transformer with coupling between each secondary inductor and the primary inductor Lp 308*b*.

Figure 6:
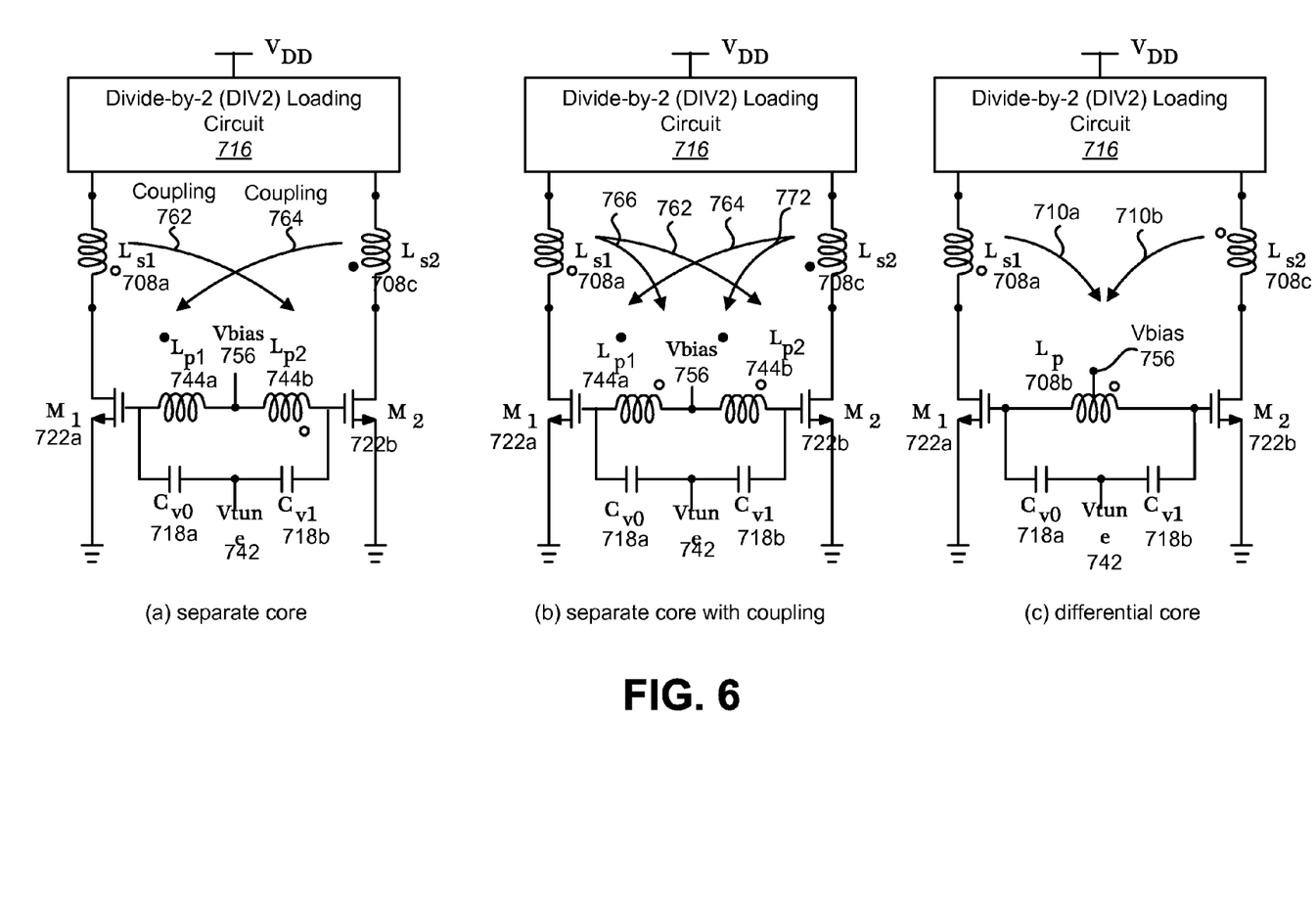
FIG. 6 is a circuit diagram illustrating the derivation of a single differential transformer core from a separate core.

FIG. 6 is a circuit diagram illustrating the derivation of a single differential transformer core 104 from a separate core. The circuits in FIG. 6 illustrate the theory to combine two main cores into a single core. In FIG. 6(*a*), a voltage controlled oscillator (VCO) with a separate core is illustrated. The voltage controlled oscillator (VCO) may include a divide-by-2 (DIV2) loading circuit 716 coupled to the separate core. The divide-by-2 (DIV2) loading circuit 716 may be coupled to VDD.

The separate core may include a first secondary inductor Ls1 708*a*, a first primary inductor Lp1 744*a*, a second primary inductor Lp2 744*b*, a second secondary inductor Ls2 708*c*, a first NMOS transistor M1 722*a*, a second NMOS transistor M2 722*b*, a first capacitor Cv0 718*a* and a second capacitor Cv1 718*b*. A coupling 762 may occur between the first secondary coil Ls1 708*a* and the second primary coil Lp2 744*b*. A coupling 764 may also occur between the second secondary coil Ls2 708*c* and the first primary coil 744*a*. The first secondary coil Ls1 708*a* and the second primary coil Lp2 744*b* may thus form a first transformer. The second secondary coil Ls2 708*c* and the first primary coil Lp1 744*a* may thus form a second transformer.

The first secondary coil Ls1 708*a* may be coupled between the divide-by-2 (DIV2) loading circuit 716 and the drain of the first NMOS transistor M1 722*a*. The source of the first NMOS transistor M1 722*a* may be coupled to ground. The gate of the first NMOS transistor M1 722*a* may be coupled to the first primary coil Lp1 744*a*. The gate of the first NMOS transistor M1 722*a* may also be coupled to the first capacitor Cv0 718*a*. The first primary coil Lp1 744*a* may also be coupled to a bias voltage Vbias 756. The second primary coil Lp2 744*b* may be coupled to both the bias voltage Vbias 756 and the gate of the second NMOS transistor M2 722*b*. The gate of the second NMOS transistor M2 722*b* may further be coupled to the second capacitor Cv1 718*b*. The source of the second NMOS transistor M2 722*b* may be coupled to ground. The drain of the second NMOS transistor M2 722*b* may be coupled to the second secondary coil Ls2 708*c*. The second secondary coil Ls2 708*c* may also be coupled to the divide-by-2 (DIV2) loading circuit 716. The first capacitor Cv0 718*a* may be coupled to a tuning voltage Vtune 742. The second capacitor CV1 718*b* may also be coupled to the tuning voltage Vtune 742.

In FIG. 6(*b*), additional coupling has been added. Thus, a coupling 766 between the first secondary inductor Ls1 708*a* and the first primary coil Lp1 744*a* may occur. A coupling 772 between the second secondary inductor Ls2 708*c* and the second coil Lp2 744*b* may further occur.

In FIG. 6(*c*), the first primary inductor Lp1 744*a* and the second primary inductor Lp2 744*b* have been combined to form a single primary inductor Lp 708*b*. The bias voltage Vbias 756 is located in the middle of the primary inductor Lp 708*b*. A first coupling 710*a* occurs between the first secondary inductor Ls1 708*a* and the primary inductor Lp 708*b*, forming a first transformer. A second coupling 710*b* occurs between the second secondary inductor Ls2 708*c* and the primary inductor Lp 708*b*, forming a second transformer.

Figure 7:
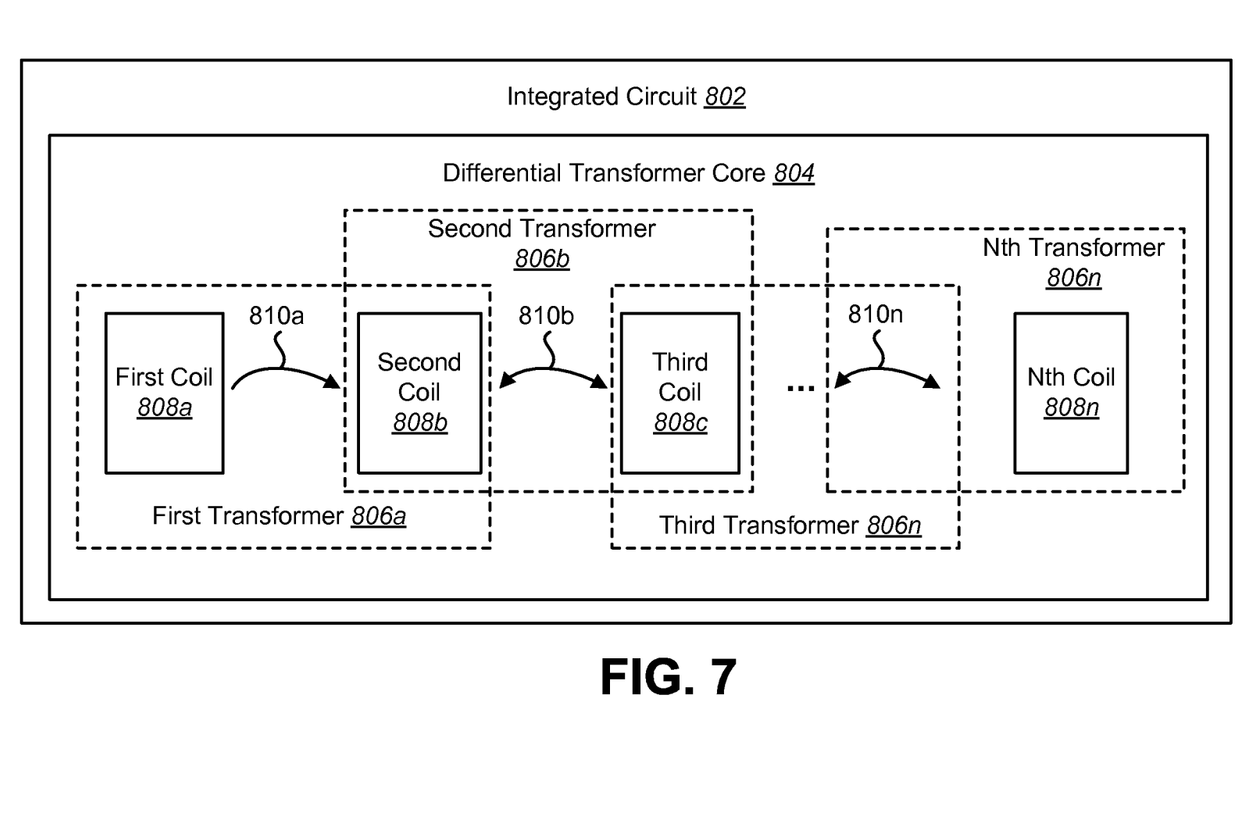
FIG. 7 is a block diagram illustrating a differential transformer core.

FIG. 7 is a block diagram illustrating a differential transformer core 804. The differential transformer core 804 may be located on an integrated circuit 802. The differential transformer core may include a first coil 808*a*, a second coil 808*b*, a third coil 808*c* and additional coils up to an nth coil 808*n*. The first coil 808*a* and the second coil 808*b* may have a coupling 810*a* such that they form a first transformer 806*a*. Likewise, the second coil 808*b* and the third coil 808*c* may have a coupling 810*b* such that they form a second transformer 806*b*. The third coil 808*c* may also be part of a third transformer with another coil (not shown). The nth coil 808*n* may have a coupling 810*n* with the n−1 coil to form the nth transformer 806*n*. There may be additional couplings (not shown) between the coils 808. For example, the Nth coil 808*n* may be coupled to the first coil 808*a* and/or the second coil 808*b*.

Figure 8:
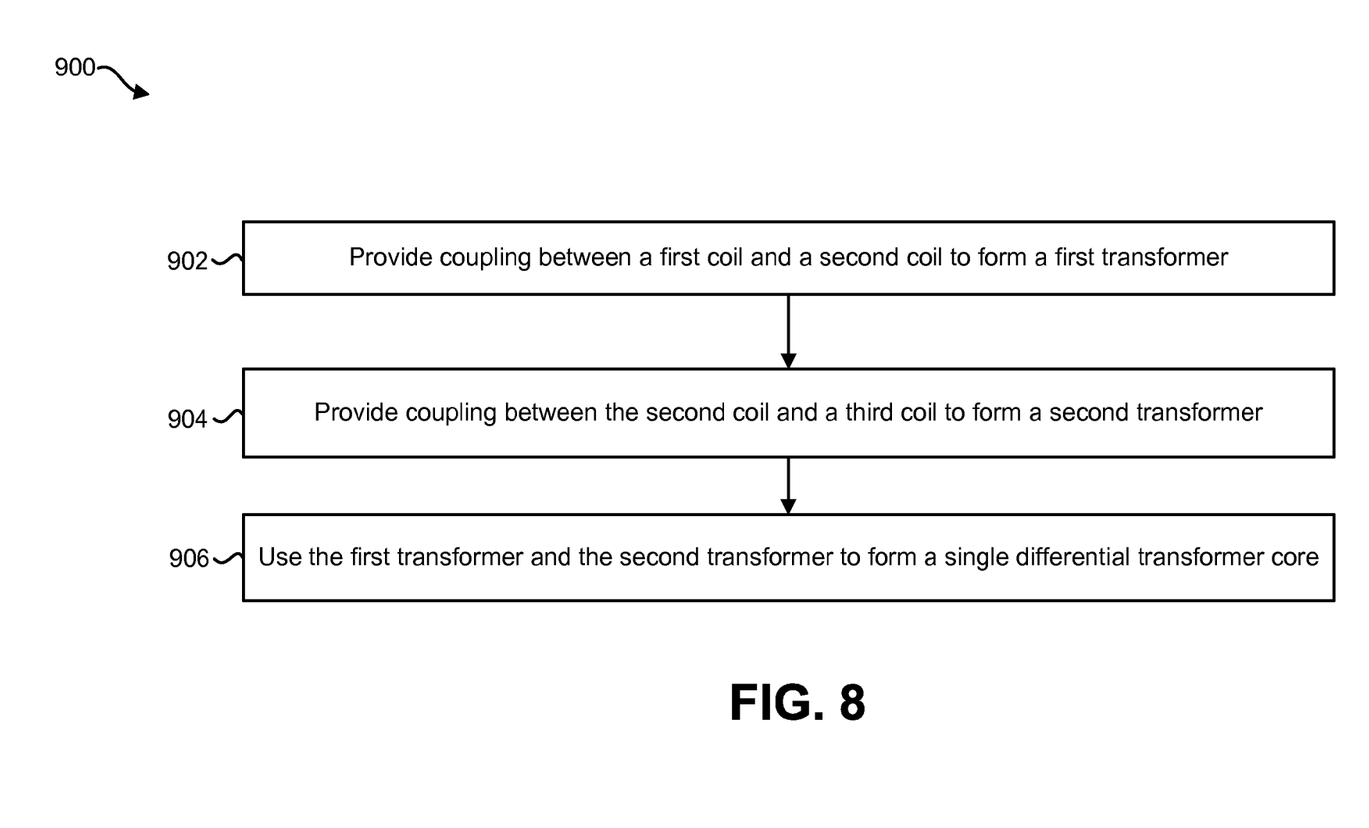
FIG. 8 is a flow diagram of a method for forming a single differential transformer core.

FIG. 8 is a flow diagram of a method 900 for forming a single differential transformer core 104. The method 900 may be performed by an electronic device. For example, the method 900 may be performed by a Global Positioning System (GPS) unit, a wireless communication device, a portable electronic device, etc. The electronic device may provide 902 a coupling 110*a* between a first coil 108*a* and a second coil 108*b* to form a first transformer 106*a*. The first coil 108*a* may be a first secondary inductor Ls1 308*a* and the second coil 108*b* may be a primary inductor Lp 308*b*. The electronic device may also provide 904 a coupling 110*b* between the second coil 108*b* and a third coil 108*c* to form a second transformer 106*b*. The third coil 108*c* may be a second secondary inductor Ls2 308*c*. The electronic device may then use 906 the first transformer 106*a* and the second transformer 106*b* to form a single differential transformer core 104.

Figure 9:
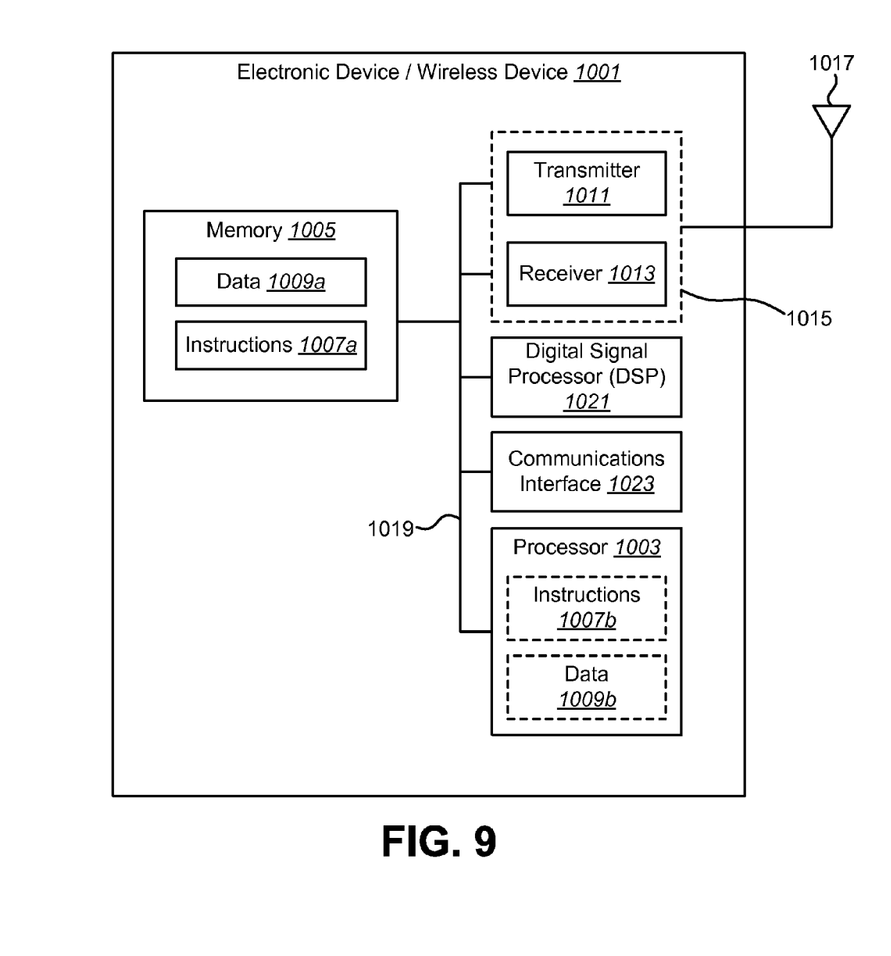
FIG. 9 shows part of a hardware implementation of an electronic device/wireless device that uses a single differential transformer core.

FIG. 9 illustrates certain components that may be included within an electronic device/wireless device 1001. The electronic device/wireless device 1001 may be an access terminal, a mobile station, a wireless communication device, a base station, a Node B, a handheld electronic device, etc. The electronic device/wireless device 1001 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the electronic device/wireless device 1001 of FIG. 9, in an alternative configuration, a combination of processors (e.g., an ARM and DSP) could be used.

The electronic device/wireless device 1001 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1007a and instructions 1009a may be stored in the memory 1005. The instructions 1009a may be executable by the processor 1003 to implement the methods disclosed herein. Executing the instructions 1009a may involve the use of the data 1007a that is stored in the memory 1005. When the processor 1003 executes the instructions 1009a, various portions of the instructions 1009b may be loaded onto the processor 1003, and various pieces of data 1007b may be loaded onto the processor 1003.

The electronic device/wireless device 1001 may also include a transmitter 1011 and a receiver 1013 to allow transmission and reception of signals to and from the electronic device/wireless device 1001. The transmitter 1011 and receiver 1013 may be collectively referred to as a transceiver 1015. An antenna 1017 may be electrically coupled to the transceiver 1015. The electronic device/wireless device 1001 may also include (not shown) multiple transmitters, multiple receivers, multiple transceivers and/or multiple antennas.

The electronic device/wireless device 1001 may include a digital signal processor (DSP) 1021. The electronic device/wireless device 1001 may also include a communications interface 1023. The communications interface 1023 may allow a user to interact with the electronic device/wireless device 1001.

The various components of the electronic device/wireless device 1001 may be coupled together by one or more buses, which may include a power bus, a control signal bus, a status signal bus, a data bus, etc. For the sake of clarity, the various buses are illustrated in FIG. 9 as a bus system 1019.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of transmission medium.

Further, it should be appreciated that modules and/or other appropriate means for performing the methods and techniques described herein, such as those illustrated by FIG. 8, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit, comprising:
   a single differential transformer core comprising:
      a primary coil;
      a first secondary coil that forms a first transformer with the primary coil; and
      a second secondary coil that forms a second transformer with the primary coil, wherein the primary coil, the first secondary coil and the second secondary coil have a layout on the integrated circuit to minimize coupling between the first secondary coil and the second secondary coil;
   a first transistor, wherein a gate of the first transistor is coupled to the primary coil, and wherein a drain of the first transistor is coupled to the first secondary coil; and
   a second transistor, wherein a gate of the second transistor is coupled to the primary coil and wherein a drain of the second transistor is coupled to the second secondary coil.

2. The integrated circuit of claim 1, wherein a first coupling occurs between the primary coil and the first secondary coil to form the first transformer, and wherein a second coupling occurs between the primary coil and the second secondary coil to form the second transformer.

3. The integrated circuit of claim 1, wherein the primary coil, the first secondary coil and the second secondary coil are inductors.

4. The integrated circuit of claim 1, wherein the single differential transformer core, the first transistor and the second transistor form a 2× oscillating core.

5. The integrated circuit of claim 4, wherein the single differential transformer core is used in a low noise amplifier.

6. The integrated circuit of claim 4, wherein the single differential transformer core is used in a power amplifier.

7. The integrated circuit of claim 4, wherein the 2× oscillating core is used with a divide-by-2 loading circuit to form a voltage controlled oscillator.

8. The integrated circuit of claim 7, wherein the primary coil is coupled between the gate of the first transistor and the gate of the second transistor, wherein the first secondary coil is coupled between the drain of the first transistor and the divide-by-2 loading circuit, and wherein the second secondary coil is coupled between the drain of the second transistor and the divide-by-2 loading circuit.

9. The integrated circuit of claim 8, wherein the first transformer and the second transformer generate frequencies that are twice a desired frequency, and wherein the divide-by-2 loading circuit outputs a first differential output with the desired frequency and a second differential output with the desired frequency.

10. The integrated circuit of claim 1, further comprising a third secondary coil, wherein the third secondary coil and the second secondary coil form a third transformer.

* * * * *